(12) United States Patent
Basceri et al.

(10) Patent No.: US 8,847,198 B2
(45) Date of Patent: Sep. 30, 2014

(54) LIGHT EMITTING DEVICES WITH BUILT-IN CHROMATICITY CONVERSION AND METHODS OF MANUFACTURING

(75) Inventors: Cem Basceri, Cary, NC (US); Thomas Gehrke, Boise, ID (US); Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 376 days.

(21) Appl. No.: 13/116,366

(22) Filed: May 26, 2011

(65) Prior Publication Data

US 2012/0298950 A1 Nov. 29, 2012

(51) Int. Cl.
*H01L 29/06* (2006.01)
*H01L 33/50* (2010.01)
*H01L 33/08* (2010.01)
*H01L 33/38* (2010.01)

(52) U.S. Cl.
CPC ............... *H01L 33/508* (2013.01); *H01L 33/08* (2013.01); *H01L 2933/0041* (2013.01); *H01L 33/38* (2013.01); *H01L 33/502* (2013.01)
USPC ............................................... 257/13; 257/98

(58) Field of Classification Search
CPC ..................... H01L 33/50; H01L 2933/0041
USPC ....................................................... 257/13, 98
See application file for complete search history.

(56) References Cited

U.S. PATENT DOCUMENTS

| | | | |
|---|---|---|---|
| 7,554,109 B2 | 6/2009 | Stokes et al. | |
| 7,772,607 B2 | 8/2010 | Lai et al. | |
| 2002/0136932 A1 | 9/2002 | Yoshida | |
| 2007/0077594 A1 | 4/2007 | Hikmet et al. | |
| 2009/0014744 A1* | 1/2009 | Hsieh et al. | 257/98 |

* cited by examiner

*Primary Examiner* — Douglas Menz
(74) *Attorney, Agent, or Firm* — Perkins Coie LLP

(57) ABSTRACT

Various embodiments of light emitting devices with built-in chromaticity conversion and associated methods of manufacturing are described herein. In one embodiment, a method for manufacturing a light emitting device includes forming a first semiconductor material, an active region, and a second semiconductor material on a substrate material in sequence, the active region being configured to produce a first emission. A conversion material is then formed on the second semiconductor material. The conversion material has a crystalline structure and is configured to produce a second emission. The method further includes adjusting a characteristic of the conversion material such that a combination of the first and second emission has a chromaticity at least approximating a target chromaticity of the light emitting device.

25 Claims, 6 Drawing Sheets

__US 8,847,198 B2__

LIGHT EMITTING DEVICES WITH BUILT-IN CHROMATICITY CONVERSION AND METHODS OF MANUFACTURING

TECHNICAL FIELD

The present disclosure is related to light emitting devices with built-in chromaticity conversion and associated methods of manufacturing.

BACKGROUND

Light emitting diodes ("LEDs") and other types of light emitting devices are widely used for background illumination in electronic devices and for signage, indoor lighting, outdoor lighting, and other types of general illumination. Light emitting devices typically emit light at only one center wavelength, and thus they do not produce white light. One conventional technique for emulating white light with LEDs includes depositing a phosphor on an LED die. FIG. 1A shows a conventional light emitting device 10 that has a support 2, an LED die 4, and a phosphor 6. FIG. 1B shows an example of an LED die 4 that includes a substrate 12, an N-type gallium nitride (GaN) material 14, GaN/indium gallium nitride (InGaN) multiple quantum wells ("MQWs") 16, a P-type GaN material 18, a first contact 20, and a second contact 22.

Referring to both FIGS. 1A and 1B, in operation, an electrical voltage is applied between the first and second contacts 20 and 22. In response to the applied voltage, the MQWs 16 of the LED die 4 produce a first emission (e.g., a blue light) that stimulates the phosphor 6 to emit a second emission (e.g., a yellow light). The combination of the first and second emissions appears generally white to human eyes if matched appropriately. As discussed in more detail below, using phosphors has certain drawbacks. Accordingly, several improvements in modifying emission of light emitting devices without using phosphors may be desirable.

DETAILED DESCRIPTION

Various embodiments of light emitting devices with built-in chromaticity conversion and associated methods of manufacturing are described below. As used hereinafter, the term "light emitting device" generally refers to LEDs, laser diodes, and/or other suitable sources of illumination other than electrical filaments, a plasma, or a gas. The term "chromaticity" generally refers to an objective specification of the quality of a color regardless of the luminance of the color. Chromaticity of the color may be determined by hue, colorfulness, saturation, chroma, intensity, and/or excitation purity. A person skilled in the relevant art will also understand that the technology may have additional embodiments, and that the technology may be practiced without several of the details of the embodiments described below with reference to FIGS. 2A-6.

Figure 2A:
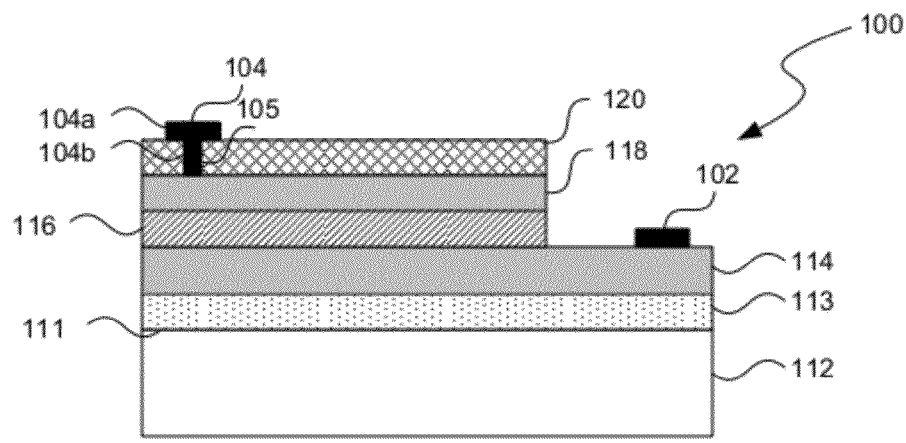
FIG. 2A is a schematic cross-sectional diagram of a light emitting device with built-in chromaticity conversion in accordance with embodiments of the technology.

FIG. 2A is a schematic cross-sectional diagram of a light emitting device 100 with built-in chromaticity conversion in accordance with embodiments of the technology. As shown in FIG. 2A, the light emitting device 100 can include a substrate material 112, an optional buffer material 113, a first semiconductor material 114, an active region 116, and a second semiconductor material 118. The light emitting device 100 also has a built-in conversion material 120 on or at least proximate the second semiconductor material 118. Even though only one conversion material 120 is shown in FIG. 2A for illustration purposes, in other embodiments, the light emitting device 100 may include two, three, four, or any other suitable number of conversion materials 120 or layers of conversion materials with different emission center wavelengths and/or other characteristics. In further embodiments, the light emitting device 100 can optionally include a reflective material (e.g., a silver film), a carrier material (e.g., a ceramic substrate), an optical component (e.g., a collimator), and/or other suitable components.

In the illustrated embodiment, the light emitting device 100 also includes a first contact 102 laterally spaced apart from a second contact 104 (e.g., gold/nickel contacts). The first contact 102 is on the first semiconductor material 104. The second contact 104 includes a first portion 104a on the conversion material 120 and a second portion 104b located in a via 105 that extends between the first portion 104a and the second semiconductor material 108. In other embodiments, the light emitting device 100 can also have a vertical, a buried, and/or other suitable types of contact configuration.

In certain embodiments, the substrate material 112 can be a growth substrate for forming the first semiconductor material 114, the active region 116, and the second semiconductor material 118. For example, the substrate material 112 can include silicon (Si), at least a portion of which has the Si(1,1,1) crystal orientation, silicon with other crystal orientations (e.g., Si(1,0,0)), AlGaN, GaN, silicon carbide (SiC), sapphire (Al$_2$O$_3$), zinc oxide (ZnO), a combination of the foregoing materials and/or other suitable substrate materials. In the illustrated embodiment, the substrate material 112 has a generally planar surface 111 proximate to the optional buffer material 113. In other embodiments, the substrate material 112 may also include a non-planar surface (e.g., having openings, channels, and/or other surface features, not shown). The substrate material 112 can alternatively be a separate support member that is attached to the semiconductor materials. In these applications, the substrate material can be made from a dielectric material, conductive material, and/or semiconductive material.

Referring to FIG. 2A, the optional buffer material 113 is configured to facilitate the formation of the first and second semiconductor materials 114 and 118 and the active region 116 on the substrate material 112. The optional buffer material 113 can include at least one of aluminum nitride (AlN), aluminum-gallium nitride (AlGaN), zinc nitride (ZnN), GaN, and/or other suitable materials. In other embodiments, the optional buffer material 113 may be omitted, and the first semiconductor material 104 may be formed directly on the surface 111 of the substrate material 112. In yet further embodiments, other intermediate materials (e.g., zinc oxide (ZnO)) may be formed on the substrate material 112 in addition to or in lieu of the buffer material 113.

The first and second semiconductor materials 114 and 118 can be configured as cladding structures for the active region 116. In certain embodiments, the first semiconductor material 114 can include an N-type GaN material (e.g., doped with silicon (Si)), and the second semiconductor material 118 can include a P-type GaN material (e.g., doped with magnesium (Mg)). In other embodiments, the first semiconductor material 114 can include a P-type GaN material, and the second semiconductor material 118 can include an N-type GaN material. In further embodiments, the first and second semiconductor materials 114 and 118 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 116 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 116 can include an InGaN SQW, InGaN/GaN MQWs, and/or an InGaN bulk material. In other embodiments, the active region 116 can include aluminum gallium indium phosphide (AlGaInP), aluminum gallium indium nitride (AlGaInN), and/or other suitable materials or configurations.

The conversion material 120 can comprise a semiconductor material formed on the second semiconductor material 118 and configured to produce a second emission stimulated by the first emission via photoluminescence. In one embodiment, the conversion material 120 may include an epitaxial bulk material (e.g., GaN) with one or more dopants 123 (FIG. 3A) introduced via doping, ion implantation, deposition, and/or other suitable techniques, as described in more detail below with reference to FIG. 3A. The dopants 123 can include at least one of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thullium (Tm), ytterbium (Yb), and/or other suitable compositions. In other embodiments, the dopants 123 can also include nanodots and/or other suitable structures.

In other embodiments, the conversion material 120 can include a superlattice structure with a particular bandgap energy. Examples of such superlattice structure include mercury telluride (HgTe)/cadmium telluride (CdTe), gallium arsenide (GaAs)/aluminum gallium arsenide (AlGaAs), and/or other suitable types of superlattice structures. One example of a superlattice structure is described in more detail below with reference to FIG. 3B.

In further embodiments, the conversion material 120 can include AlGaInP, AlGaInN, and/or other suitable semiconductor materials configured as SQW, MQWs, and/or a bulk material. In yet further embodiments, the conversion material 120 can include a combination of the foregoing structures and/or compositions. In any of the foregoing embodiments, the first semiconductor material 114, the active region 116, the second semiconductor material 118, the buffer material 113, and the conversion material 120 can be formed on the substrate material 112 via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques.

The second emission produced by the conversion material 120 may be selected based on a target chromaticity of the light emitting device 100. For example, the second emission may have a particular chromaticity such that a combination of the first and second emissions appears white to human eyes. In other examples, the combination of the first and second emissions may have another target chromaticity. In any of the foregoing examples, combining the second emission with the first emission may modify, impact, and/or otherwise influence the output chromaticity of the light emitting device 100.

In one embodiment, the second emission and corresponding conversion material 120 may be selected based on empirical data. For example, calibration tests may be carried out to test the chromatographic properties of the combined emissions. In other embodiments, the second emission and corresponding conversion material 120 may be selected based on the bandgap energies of the active region 116 and/or the conversion material 120. In further embodiments, the selection may be based on a combination of the foregoing techniques and/or other suitable techniques. One example of a selection technique is described in more detail below with reference to FIGS. 5A and 5B.

In operation, an electrical voltage applied between the first and second contacts 102 and 104 causes an electrical current (not shown) to flow between the first and second contacts 102 and 104 via the first semiconductor material 114, the active region 116, and the second semiconductor material 118. In response to the applied voltage and resulting current, the active region 116 produces the first emission (e.g., a blue light). The conversion material 120 then absorbs at least a portion of the first emission and produces the second emission (e.g., a yellow light). The combined first and second emissions with certain desired characteristics (e.g., appearing white or another color to human eyes) are then emitted to an external environment.

Figure 1A:
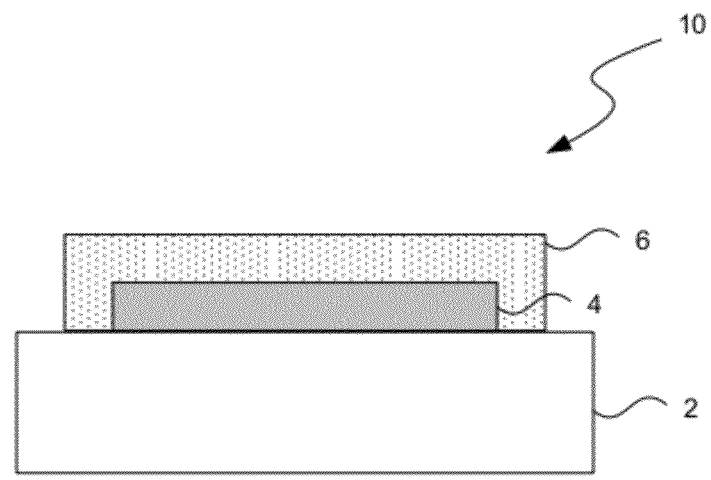
FIG. 1A is a schematic cross-sectional diagram of a light emitting device in accordance with the prior art.
Figure 1B:
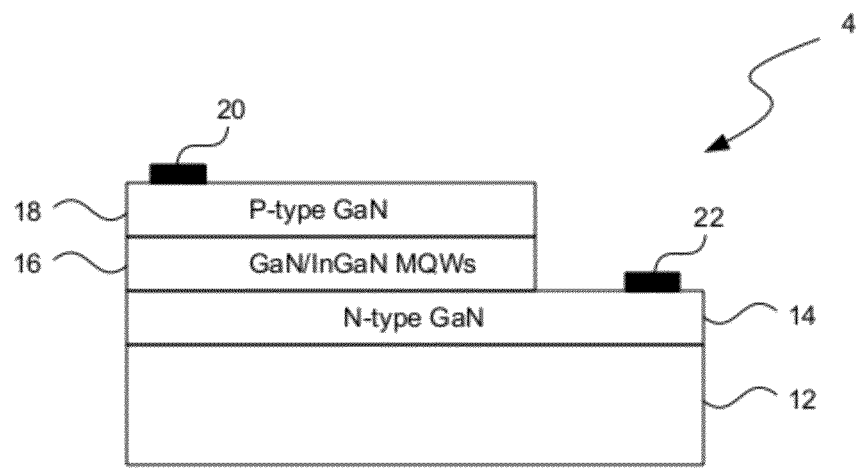
FIG. 1B is a schematic cross-sectional diagram of an LED die in accordance with the prior art.

Several embodiments of the light emitting device 100 are expected to produce white light with increased optical efficiency compared to conventional devices that use phosphors. For example, the optical efficiency of the light emitting device 10 in FIG. 1A is rather low because the phosphor 6 (FIG. 1A) absorbs a portion of the first emission from the LED die 4 in order to produce the second emission. The phosphor 6, for example, typically converts only about 50% to 60% of the absorbed first emission to the second emission. As a result, about 40% to 50% of the absorbed first emission is lost to heat that must be dissipated. In contrast, embodiments of the conversion material 120 can convert about 80% to about 90% of the absorbed first emission. Accordingly, the light emitting device 100 with the conversion material 120 can achieve higher optical efficiencies and produce less heat than conventional phosphor-based devices.

Embodiments of the light emitting device 100 can also produce white light with increased reliability and longer useful life as compared to conventional devices that have a phosphor with a luminescence composition (e.g., Cerium(III)-doped Yttrium Aluminum garnet) in a matrix substrate (e.g., a silicone elastomer). It has been observed that both the luminescence composition and the matrix substrate can degrade over time when exposed to the high junction temperatures of LED dies due at least in part to oxidation, depolymerization, crystal lattice rearrangement, and/or other chemical/mechanical mechanisms. As a result, conventional devices with phosphors tend to become less reliable over time. Accordingly, by eliminating phosphors, the light emitting device 100 can have increased reliability and a longer, more useful life.

Further, embodiments of the light emitting device 100 can be less complicated to manufacture and have lower costs compared to conventional devices. In conventional devices, both the amount, shape, and the composition of the phosphor must be precisely controlled to achieve the desired emission characteristic. For example, the phosphor can have different light emitting properties that range between a central region and a peripheral region of a conventional LED die because of temperature differences of these regions. Thus, the deposition of the phosphor must be precisely controlled to achieve consistent light emitting properties. Such precise deposition control adds complexity and higher costs to the manufacturing process. In contrast, embodiments of the light emitting device 100 can be readily formed on a wafer level via MOCVD, MBE, LPE, HVPE, atomic layer deposition, and/or other suitable epitaxial growth techniques. As a result, a large number of light emitting devices (not shown) may be produced at once, and thus the process can be less complicated and more cost effective than conventional techniques.

Figure 2B:
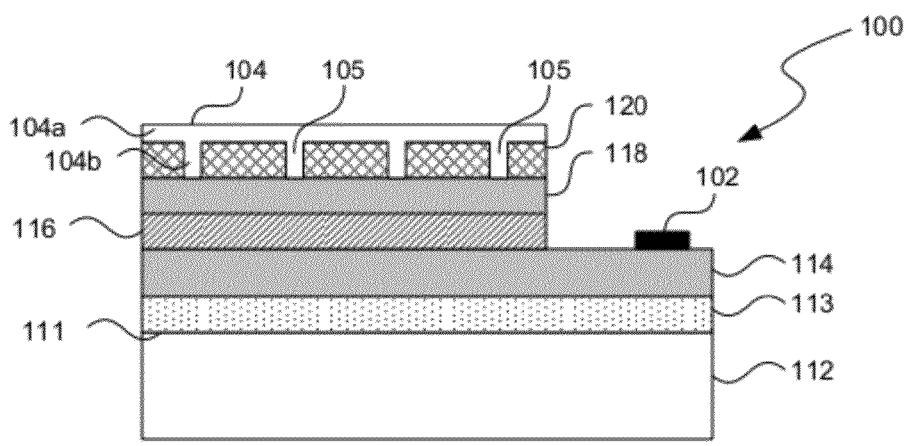
FIG. 2B is a schematic cross-sectional diagram of a light emitting device with built-in chromaticity conversion in accordance with additional embodiments of the technology.

Even though the second contact 104 is shown in FIG. 2A as extending through the conversion material 120, in other embodiments, the conversion material 120 can have other configurations. For example, as shown in FIG. 2B, the conversion material 120 can include a plurality of vias 105, and the second contact 104 includes a first portion 104a external to the vias 105 and a second portion 104b in the vias 105. As shown in FIG. 2B, the first portion 104a covers substantially the entire surface area of the conversion material 120. In such embodiments, the second contact 104 can include indium tin oxide, zinc oxide, fluorine-doped tin oxide, antimony tin oxide, and/or other suitable transparent conductive materials.

Figure 2C:
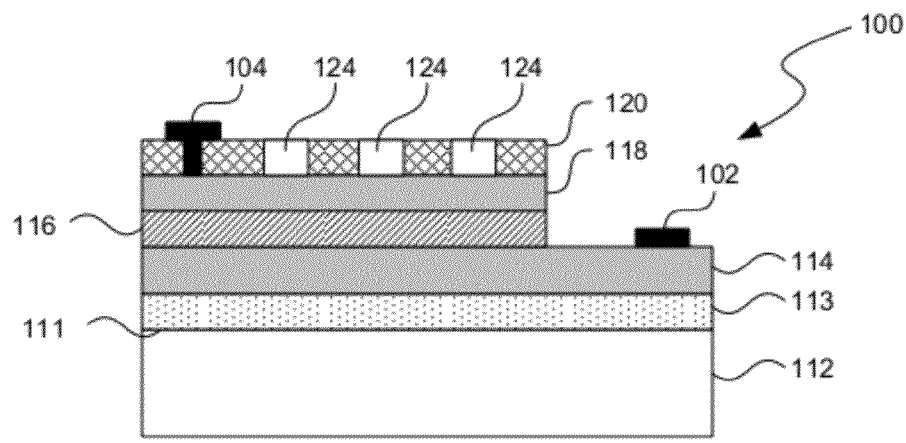
FIG. 2C is a schematic cross-sectional diagram of a light emitting device with built-in chromaticity conversion in accordance with further embodiments of the technology.

The conversion material 120 can also include other suitable structural features. For example, as shown in FIG. 2C, the conversion material 120 can be interrupted by having a plurality of gaps 124. In one embodiment, the gaps 124 may be filled with nitrogen ($N_2$), argon (Ar), and/or other suitable gases. In other embodiments, the gaps 124 may be filled with a semi-transparent or transparent material (e.g., silicon oxide) liquid or solid material. In further embodiments, the conversion material 120 may also include channels, surface roughness, and/or other suitable structure features.

In certain embodiments, the structural features of the conversional material 120 may also be adjusted to achieve a target luminance pattern for the light emitting device 100. For example, even though the gaps 124 are shown in FIG. 2C as generally similar in size and spacing, in certain embodiments, the gaps 124 may have different sizes, shapes and/or spacing in different areas of the conversion material 120. Thus, the intensity values of the second emission produced from the different areas of the conversion material 120 may differ. As a result, the light emitting device 100 may produce different chromaticity values from different areas of the conversion material 120.

Figure 3A:
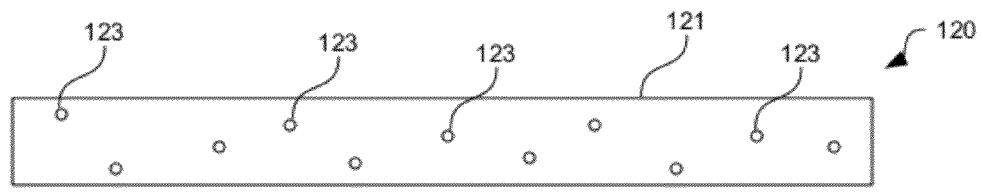
FIG. 3A is a schematic cross-sectional diagram of a conversion material useful for the light emitting device in FIGS. 2A-2C in accordance with embodiments of the technology.

FIG. 3A is a schematic cross-sectional diagram of a conversion material 120 useful for the light emitting device 100 in FIGS. 2A-2C in accordance with embodiments of the technology. In one embodiment, the conversion material 120 can include an epitaxial bulk material 121 (e.g., GaN) with one or more dopants 123 that are formed via doping, ion implantation, deposition, and/or other suitable doping techniques. In other embodiments, the conversion material embodiments, the conversion material 120 may also include an optional buffer (e.g., zinc oxide (ZnO), not shown) proximate the second semiconductor material 118 (FIG. 2A).

In certain embodiments, the dopants 123 may be introduced onto a surface of the epitaxial bulk material 121 and subsequently annealed to achieve a target penetration depth and/or density in the epitaxial bulk material 121. The dopants 123 may be distributed generally evenly in the epitaxial bulk material 121, or the dopants 123 may have a density or concentration gradient along at least one dimension of the epitaxial bulk material 121. In further embodiments, the dopants 123 may be distributed generally evenly in a first area and may have a different density or concentration gradient in a second area of the epitaxial bulk material 121. In yet further embodiments, the dopants 123 may be introduced via other suitable techniques and/or may have other suitable composition profiles.

Figure 3B:
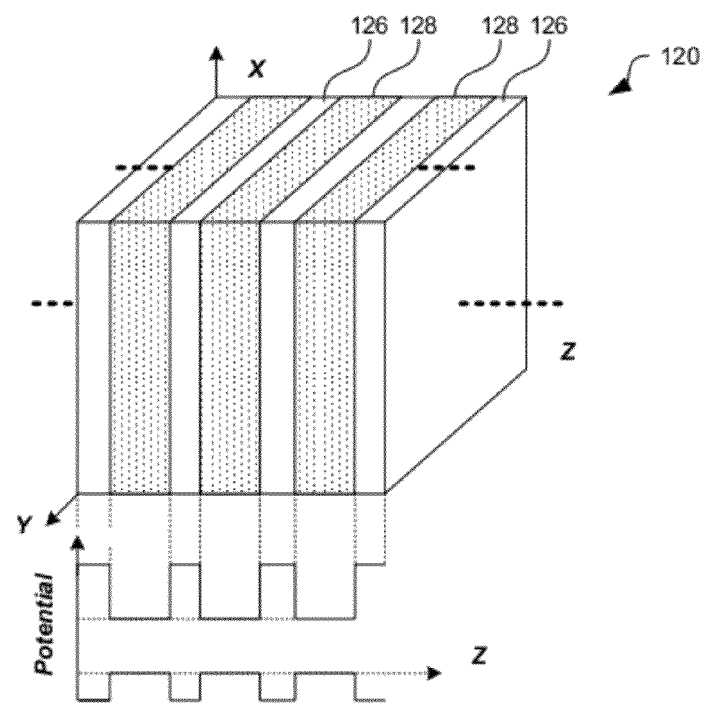
FIG. 3B is a schematic cross-sectional diagram of a conversion material useful for the light emitting device in FIGS. 2A-2C in accordance with additional embodiments of the technology.

FIG. 3B is a schematic cross-sectional diagram of a conversion material 120 that has a superlattice structure and corresponding bandgap diagram in accordance with additional embodiments of the technology. As shown in FIG. 3B, the conversion material 120 can include a plurality of alternating first and second compositions 126 and 128. The first composition 126 can have a first bandgap that is larger than the second bandgap of the second composition 128. As a result, charge carriers (e.g., electrons and holes) are more likely to be restricted in the individual second compositions 128 and intra-composition transport may be limited.

In certain embodiments, the composition and/or thickness of the first and/or second compositions 126 and 128 may be adjusted based on the target chromaticity of the light emitting device 100 (FIG. 2A). For example, in one embodiment, the first and/or second bandgaps may be selected based on the wavelength of the target emission from the conversion material 120. In other embodiments, the thickness of the first and/or second compositions 126 and 128 may be adjusted to vary the intra-composition charge carrier transport. In further embodiments, other suitable characteristics of the superlattice structure may be adjusted in addition to or in lieu of the foregoing parameters.

Figure 4:
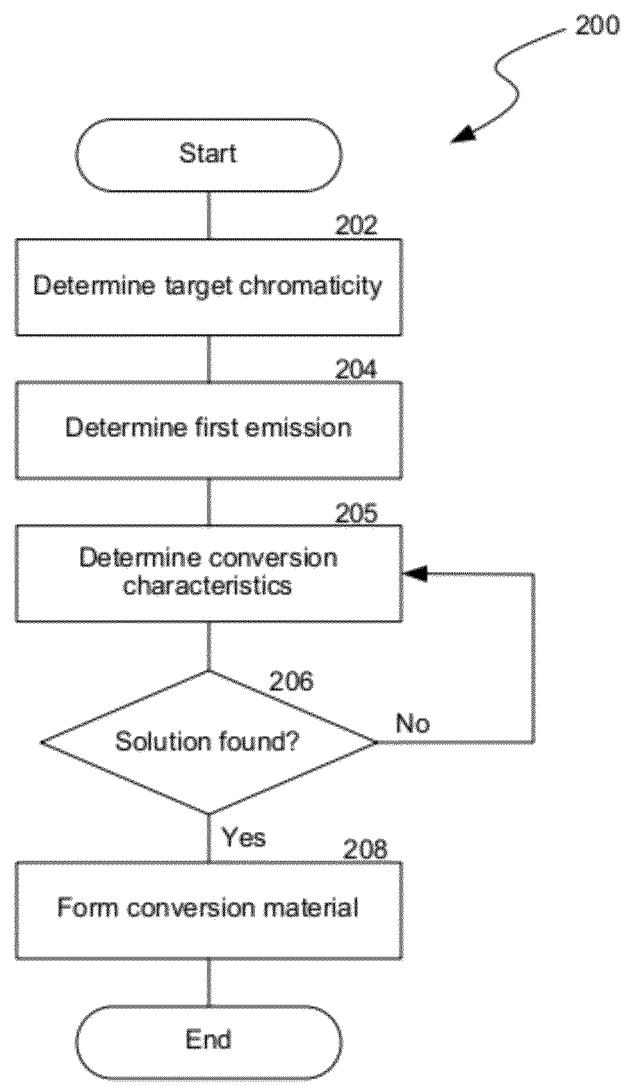
FIG. 4 is a flowchart illustrating a method for forming embodiments of the light emitting devices in FIGS. 2A-2C in accordance with embodiments of the technology.

FIG. 4 is a flowchart illustrating a method 200 for forming embodiments of the light emitting device 100 in FIGS. 2A-2C in accordance with embodiments of the technology. The method 200 includes determining the target chromaticity for the light emitting device 100 (block 202). In one embodiment, the target chromaticity is white light at ambient temperatures. In other embodiments, the target chromaticity can have other suitable values.

The method 200 can also include determining the emission characteristics of the first emission from the active region (block 204). For example, a center emission wavelength (or frequency) of the first emission may be determined, or the chromaticity value of the first emission may be determined. In further embodiments, a combination of the foregoing characteristics and/or other suitable characteristics of the first emission may be determined.

The method 200 can further include determining the conversion characteristics for the conversion material 120 (block 205). In one embodiment, the process may be recursive. For example, the chromaticity value for the second emission from the conversion material 120 may be estimated based on previously collected data and/or other suitable sources, and then the combined chromaticity value may be calculated and/or tested via experimentation by combining the chromaticity values of the first and second emissions. An error between the target chromaticity value and the current value of the combined chromaticity value may be generated. The error can then be used to modify the estimated chromaticity value for the second emission. The foregoing process is repeated until the error is within an acceptable range. In other embodiments, the conversion characteristics for the conversion material 120 may be determined with non-recursive and/or other suitable types of processes.

The method 200 also can include an assessment of whether there is a solution of the conversion characteristics (block 206). If a solution is found, the process proceeds by forming the conversion material 120 via MOCVD, MBE, LPE, HVPE, and/or other suitable epitaxial growth techniques (block 208). If a solution is not found, the process reverts to further determining the conversion characteristics for the conversion material 120 at block 205.

Figure 5A:
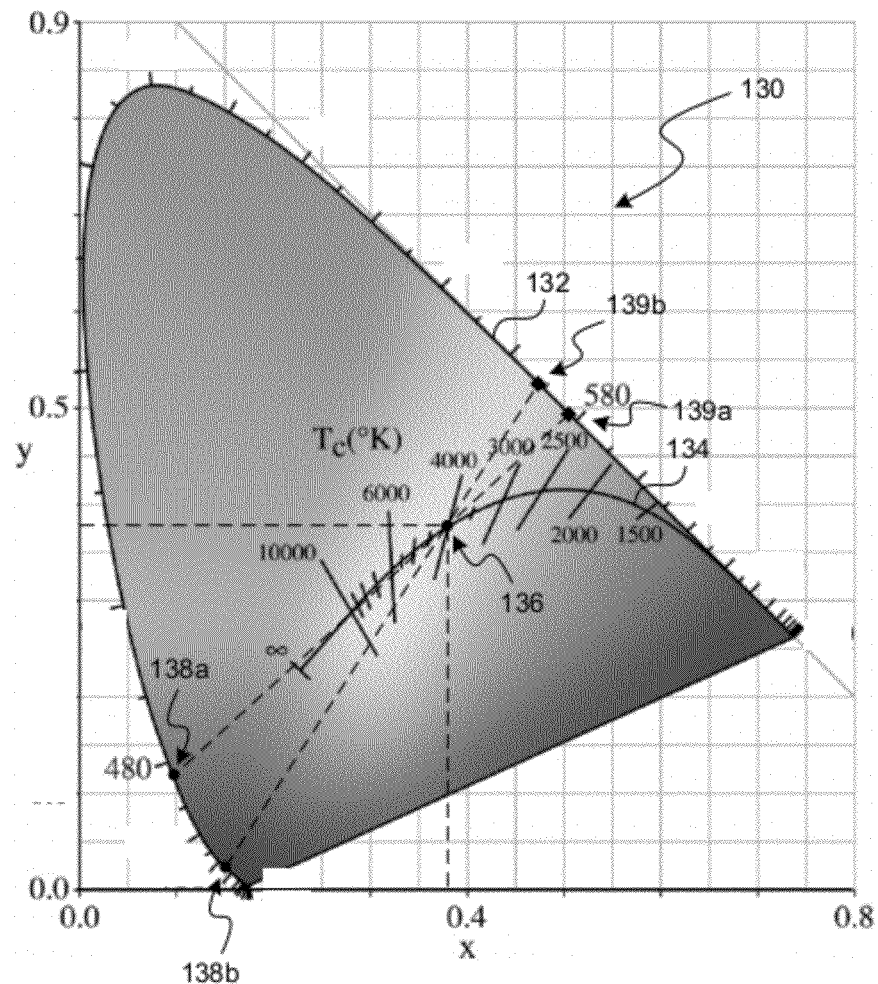
FIGS. 5A and 5B are chromaticity plots of examples of combined emission from an LED die with a conversion material in accordance with embodiments of the technology.
Figure 5B:
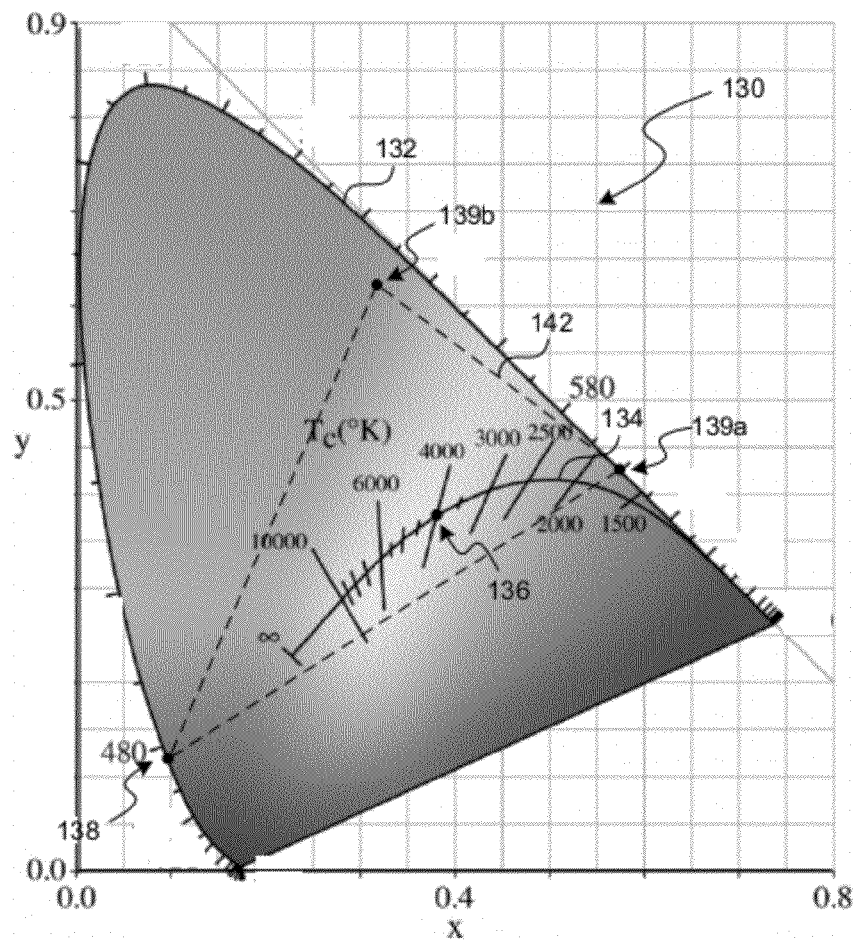

FIGS. 5A and 5B contain chromaticity plots of examples of combined first and second emissions in accordance with embodiments of the technology. For illustration purposes, the chromaticity plots are based on International Commission on Illumination (CIE) 1931 color space, though other types of color spaces (e.g., RGB color space) may also be used. In FIG. 5A one conversion material is illustrated, and in FIG. 5B two conversion materials are illustrated. In other embodiments, three, four, or any other desired number of conversion materials may be used.

As shown in FIGS. 5A and 5B, the chromaticity plot 130 includes a generally parabolic curve (commonly referred to as a spectral locus 132) and a black body curve 134 inside the spectral locus 132. The black body curve 134 may be defined by Planck's law as follows:

$$I(v, T)dv = \left(\frac{2hv^3}{c^2}\right)\frac{1}{e^{\frac{hv}{kT}} - 1}dv$$

where I(v,T)dv is an amount of energy emitted in the frequency range between v and v+dv by a black body at temperature T; h is the Planck constant; c is the speed of light in a vacuum; k is the Boltzmann constant; and v is the frequency of electromagnetic radiation.

Without being bound by theory, it is believed that an average observer perceives the color white when the (x, y) color coordinates of an emission fall on or at least in the vicinity of the black body curve 134 for a given temperature range (e.g., 2,000° K to about 10,000° K). It is also believed that if one chooses any two points of color on the chromaticity plot 130, then all the colors that lie in a straight line between the two points can be formed or at least approximated by mixing those two colors. Also, all of the colors that can be formed or at least approximated by mixing three sources are found inside a triangle formed by the source points on the chromaticity plot 130.

Based on the foregoing understanding, the operator and/or a controller (not shown) can select a conversion material to at least approximately match the first emission from the active region 116 (FIG. 2A) of the light emitting device 100 (FIG. 2A). One example of using a single conversion material 120 is shown in FIG. 5A. As shown in FIG. 5A, the active region 116 has a first emission peak 138a at least proximate to about 478 nm on the spectral locus 132. If the light emitting device 100 operates at about 4,000° K, an average person would perceive the color white at a black body emission point 136 near (0.38, 0.38) on the chromaticity plot 130. Thus, for the first emission, drawing a line between the first emission peak 138a and the black body emission point 136 would yield a conversion wavelength of about 579 nm. As a result, if a conversion material 120 that emits a wavelength or wavelengths of 579 nm is formed on the second semiconductor material 118 (FIG. 2A), the resulting combined first and second emissions would be close to or at least approximate true white light based on the black body curve 134. If a second emission peak 138b is at least proximate to about 456 nm, however, a conversion wavelength 139b of about 586 nm would be needed.

FIG. 5B illustrates another example where two conversion materials 120 are used to match the emission of the active region 116. As shown in FIG. 5B, the active region 116 has an emission point 138 at least proximate to about 478 nm. First and second conversion materials 120 have a first conversion emission point 139a and a second conversion emission point 139b, respectively. Thus, the emission point 138 of the active region 116 and the first and second conversion emission points 139a and 139b form a triangle 142 that encompasses a black body emission point 136 for 4,000° K. As a result, combining the foregoing emissions would yield an emission that is at least approximate to a black body curve 134. In one embodiment, the combination of the first and second conversion materials 120 may be determined empirically. In other embodiments, the ratio and/or other characteristics of the first and second conversion materials 120 may be determined based on suitable color correction formulas.

In any of the embodiments discussed above with reference to FIGS. 5A and 5B, the operator and/or the controller can also select a thickness and/or a density of the conversion material 120 to achieve a target ratio (referred to as "absorption ratio" hereinafter) of absorbed to non-absorbed first emission based on the target chromaticity. The absorption ratio is believed to at least influence the chromaticity of the combined first and second emissions. Without being bound by theory, it is believed that larger thicknesses and/or higher densities of the conversion material 120 can result in higher absorption ratio of the first emission than smaller thicknesses and/or lower densities. As a result, the operator and/or the controller can select a thickness and/or density of the conversion material 120 based on, for example, empirical data and/or other suitable criteria to achieve a target absorption ratio.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A light emitting device, comprising:
   a first semiconductor material;
   a first contact on the first semiconductor material;
   a second semiconductor material spaced apart from the first semiconductor material;
   a conversion material on the second semiconductor material, the conversion material including a superlattice structure;
   an active region between the first and second semiconductor materials, the active region being configured to produce a first emission via electroluminescence; and
   a second contact having a first portion on the conversion material and a second portion extending through the conversion material to the second semiconductor material, wherein:
   the conversion material is configured to produce a second emission after being stimulated by the first emission via photoluminescence;
   the superlattice structure has a bandgap corresponding to the second emission; and a combination of the first and second emissions approximates a target chromaticity.

2. The light emitting device of claim 1 wherein:
the first semiconductor material includes an N-type gallium nitride (GaN) material;
the second semiconductor material includes a P-type GaN material;
the conversion material is stacked on the second semiconductor material; and
the active region includes at least one of a bulk indium gallium nitride (InGaN) material, an InGaN single quantum well ("SQW"), and GaN/InGaN multiple quantum wells ("MQWs").

3. The light emitting device of claim 2 wherein the conversion material includes mercury telluride (HgTe)/cadmium telluride (CdTe) and/or gallium arsenide (GaAs)/aluminum gallium arsenide (AlGaAs).

4. The light emitting device of claim 1 wherein the superlattice structure is a semimetal superlattice structure.

5. The light emitting device of claim 1 wherein the conversion material includes a via exposing a portion of the second semiconductor material to facilitate electrical connection.

6. The light emitting device of claim 1 wherein the conversion material is interrupted.

7. The light emitting device of claim 1 wherein the conversion material includes a plurality of openings with generally similar dimensions.

8. The light emitting device of claim 1 wherein:
the conversion material includes a plurality of vias individually exposing a portion of the second semiconductor material;
the plurality of vias include a first via having a first size and a second via having a second size; and
the first size is different than the second size.

9. The light emitting device of claim 1 wherein:
the conversion material includes a plurality of vias individually exposing a portion of the second semiconductor material;
the plurality of vias includes a first group of vias having a first size in a first area of the conversion material and a second group of vias having a second size in a second area spaced apart from the first area of the conversion material; and
the first size is different than the second size.

10. The light emitting device of claim 1 wherein:
the conversion material includes a plurality of vias individually exposing a portion of the second semiconductor material;
the plurality of vias includes a first group of vias having a first size in a first area of the conversion material and a second group of vias having a second size in a second area spaced apart from the first area of the conversion material;
the first size is different than the second size;
the first area is in a central area of the conversion material; and
the second area is in a peripheral area of the conversion material.

11. The light emitting device of claim 1 wherein:
the conversion material includes a plurality of vias individually exposing a portion of the second semiconductor material;
the light emitting device further includes a contact having a first portion and a second portion;
the first portion of the contact is on the conversion material;
the second portion of the contact is located in the plurality of vias and extends between the first portion and the second semiconductor material; and
the contact includes at least one of indium tin oxide, zinc oxide, antimony zinc oxide, and fluorine-doped tin oxide.

12. The light emitting device of claim 1 wherein the conversion material does not include a phosphor.

13. The light emitting device of claim 1 wherein the conversion material has a crystalline structure.

14. The light emitting device of claim 1 wherein the combination of the first and second emissions appears white to the human eye.

15. The light emitting device of claim 1 wherein the conversion material is configured to absorb a portion of the first emission and to convert from about 80% to about 90% of the absorbed portion of the first emission into the second emission.

16. The light emitting device of claim 1 wherein the conversion material includes a plurality of gaps containing gas.

17. The light emitting device of claim 1 wherein the conversion material includes a plurality of gaps containing semitransparent or transparent liquid or solid material.

18. The light emitting device of claim 1 wherein the conversion material includes a plurality of gaps having different sizes, shapes, and/or spacing in different areas of the conversion material such that the light emitting device produces different chromaticity values from different areas of the conversion material.

19. The light emitting device of claim 1 wherein the conversion material has a thickness and/or a density selected to achieve a target ratio of absorbed to non-absorbed first emission based on the target chromaticity.

20. A light emitting device, comprising:
a first semiconductor material;
a first contact on the first semiconductor material;
a second semiconductor material spaced apart from the first semiconductor material;
a conversion material on the second semiconductor material, the conversion material including a gallium nitride (GaN) epitaxial bulk material with a dopant;
an active region between the first and second semiconductor materials, the active region being configured to produce a first emission via electroluminescence; and
a second contact having a first portion on the conversion material and a second portion extending through the conversion material to the second semiconductor material, wherein:
the conversion material is configured to produce a second emission after being stimulated by the first emission via photoluminescence; and
a combination of the first and second emissions approximates a target chromaticity.

21. The light emitting device of claim 20 wherein:
the dopant is europium (Eu) and/or erbium (Er); and
the dopant has a concentration corresponding to the second emission.

22. The light emitting device of claim 20 wherein the dopant is not distributed evenly within the gallium nitride (GaN) epitaxial bulk material.

23. The light emitting device of claim 20 wherein the conversion material does not include a phosphor.

24. The light emitting device of claim 20 wherein the combination of the first and second emissions appears white to the human eye.

25. The light emitting device of claim 20 wherein the conversion material is configured to absorb a portion of the first emission and to convert from about 80% to about 90% of the absorbed portion of the first emission into the second emission.

\* \* \* \* \*